US008851385B2

(12) United States Patent
Vogt et al.

(10) Patent No.: US 8,851,385 B2
(45) Date of Patent: Oct. 7, 2014

(54) CARD LAMINATION

(71) Applicant: Identive Group, Inc., Santa Ana, CA (US)

(72) Inventors: Werner Vogt, Remetschwil (CH); Andreas Looser, Rheineck (CH); Christian Looser, Lutzenberg (CH); Andreas Braun, Wolfhalden (CH)

(73) Assignee: Identive Group, Inc., Santa Ana, CA (US)

( * ) Notice: Subject to any disclaimer, the term of this patent is extended or adjusted under 35 U.S.C. 154(b) by 0 days.

(21) Appl. No.: 13/858,582

(22) Filed: Apr. 8, 2013

(65) Prior Publication Data

US 2013/0240632 A1    Sep. 19, 2013

Related U.S. Application Data

(63) Continuation of application No. 13/594,398, filed on Aug. 24, 2012, now abandoned.

(60) Provisional application No. 61/527,882, filed on Aug. 26, 2011.

(51) Int. Cl.
G06K 19/02     (2006.01)
G06K 19/077    (2006.01)
H01L 21/50     (2006.01)

(52) U.S. Cl.
CPC .... *G06K 19/07749* (2013.01); *G06K 19/07728* (2013.01); *G06K 19/07722* (2013.01); *H01L 21/50* (2013.01)
USPC ............................. 235/488; 235/451; 235/492

(58) Field of Classification Search
USPC ........................ 235/375, 451, 488, 492, 380
See application file for complete search history.

(56) References Cited

U.S. PATENT DOCUMENTS

| 6,923,378 | B2 * | 8/2005 | Jones et al. | 235/488 |
| 7,147,027 | B2 * | 12/2006 | Kano et al. | 156/382 |
| 7,823,792 | B2 * | 11/2010 | Bi et al. | 235/492 |
| 2004/0155114 | A1 * | 8/2004 | Rietzler | 235/492 |
| 2005/0040243 | A1 * | 2/2005 | Bi et al. | 235/492 |
| 2007/0272760 | A1 * | 11/2007 | Le Gouic et al. | 235/492 |
| 2008/0265435 | A1 * | 10/2008 | Charles et al. | 257/778 |
| 2009/0250521 | A1 * | 10/2009 | Fujita et al. | 235/488 |

(Continued)

FOREIGN PATENT DOCUMENTS

| CN | 1258252 | 6/2000 |
| DE | 19843425 | 3/2000 |

OTHER PUBLICATIONS

International Search Report and Written Opinion from PCT patent application No. PCT/US2012/052310, issued Nov. 15, 2012, 12 pages.

*Primary Examiner* — Tuyen K Vo
(74) *Attorney, Agent, or Firm* — Proskauer Rose LLP

(57) ABSTRACT

Described herein are RFID structures and methods of manufacturing RFID structures. An antenna substrate is provided. A first stack layer is provided. An antenna assembly including an antenna track, and at least two contact pads, are formed on a first surface of the antenna substrate. An integrated circuit unit is coupled to the at least two contact pads. A first surface of the first stack layer, the first surface of the antenna substrate, or both are coated with a unidirectional thermally expansive coating material. The first surface of the antenna substrate is positioned to be adjacent to the first surface of the first stack layer.

20 Claims, 4 Drawing Sheets

(56) References Cited

U.S. PATENT DOCUMENTS

2011/0031319 A1* 2/2011 Kiekhaefer et al. .......... 235/492
2011/0266351 A1* 11/2011 Wagner et al. ................ 235/488
2011/0267254 A1* 11/2011 Semar et al. .................. 343/870

* cited by examiner

CARD LAMINATION

This application claims priority to Ser. No. 13/594,398, filed on Aug. 24, 2012, which claims priority to Ser. No. 61/527,882, filed on Aug. 26, 2011, the entire disclosure of which is incorporated herein by reference.

FIELD OF THE TECHNOLOGY

The technology relates generally to laminate structures and methods for forming laminate structures.

BACKGROUND

Smartcard technology is directed to structures with embedded integrated circuit units. Smartcards can be contact-based (e.g., conforming to ISO/IEC 7810 and ISO/IEC 7816), contactless (e.g., Radio-Frequency Identification (RFID) card), or a dual-interface (e.g., both contact-based and contactless). RFID technology is directed to wireless communication between one object, typically referred to as a RFID tag, and another object, typically referred to as a RFID reader/writer. RFID technology, and smartcard technology in general, has been adopted, and is increasingly being used, in virtually every industry, including, for example, manufacturing, transportation, retail, and waste management.

Laminated smartcards (contact-based or contactless), tickets and passports are typically made by sandwiching layers of plastic together. At the inner most layer is an RFID antenna assembly structure, which can be made by embedding wires into a plastic sheet, printing an antenna using conductive ink onto a plastic sheet, and/or etching a copper or aluminum clad sheet of plastic to create a conductive trace as an antenna. An integrated circuit unit (including, e.g., a semiconductor chip) is coupled to the antenna assembly structure. The integrated circuit can include, for example, a complex microprocessor for a smartcard or a passport, or a more simple circuit for a building access card or ticket.

FIG. 1 is a cross-sectional view of an exemplary laminated structure according to the prior art. Layer 5 is an antenna substrate that supports an antenna assembly and an integrated circuit unit 6. Layer 4 is a bonding material used to adhere the antenna substrate to Layer 3. Layer 3 is a white core PVC with heat seal coating HS-26 or similar seal coating. Layer 2 is a white core PVC front-side layer that can include print information. Layer 1 is a PVC overlay with a standard heat seal and/or protective coating. Between the antenna assembly/IC unit and the layers, air gaps 7 can form given the antenna and IC unit components and resultant non-uniformity of the antenna substrate.

When such gaps (or empty spaces) are present in the laminated structure, for example, being caused by the chip recess and/or the conductors (e.g., antenna tracks) on the antenna assembly, these gaps or spaces can cause small undulations on the surface of the laminated structure. Such artifacts are considered undesirable and detract from the quality of the card. In addition, thermal printing processes typically require an extremely flat surface to make uniform colors. If the surface is not flat, a blemish can be seen on a card after printing.

SUMMARY OF THE INVENTION

Therefore, what is needed is a technique for making a laminated smartcard including an embedded antenna assembly and integrated circuit unit that reduces the occurrence of air gaps and other flaws or deformities, to result in a smartcard that exhibits a uniformly flat surface.

The invention, in one aspect, features a method of manufacturing an RFID structure. An antenna substrate is provided. A first stack layer is provided. An antenna assembly including an antenna track, and at least two contact pads, are formed on a first surface of the antenna substrate. An integrated circuit unit is coupled to the at least two contact pads. A first surface of the first stack layer, the first surface of the antenna substrate, or both are coated with a unidirectional thermally expansive coating material. The first surface of the antenna substrate is positioned to be adjacent to the first surface of the first stack layer.

The invention, in another aspect, features an RFID structure. The structure comprises an antenna substrate including, on a first surface, an antenna assembly having an antenna track and at least two contact pads. The structure also comprises an integrated circuit unit coupled to the at least two contact pads, a first stack layer positioned adjacent to the first surface of the antenna substrate, and an unheated unidirectional thermally expansive material separating the antenna substrate and the first stack layer, where gaps are defined between one or more portions of the antenna assembly and the thermally expansive material.

The invention, in another aspect, features an RFID structure. The structure comprises an antenna substrate including, on a first surface, an antenna assembly having an antenna track and at least two contact pads. The structure also comprises an integrated circuit unit coupled to the at least two contact pads, a first stack layer positioned adjacent to the first surface of the antenna substrate, and a previously heated unidirectional thermally expansive material separating the antenna substrate and the first stack layer, where gaps formed between the antenna substrate and the first stack layer are at least partially filled by the thermally expansive material.

In some embodiments, any of the above aspects can include one or more of the following features. In some embodiments, a second stack layer is provided, a first surface of the second stack layer or a second surface of the antenna substrate opposite the first surface of the antenna substrate is coated with the thermally expansive coating material, and the first surface of the second stack layer is positioned to be adjacent to the second surface of the antenna substrate. In some embodiments, a second antenna assembly including a second antenna track is formed on the second surface of the antenna substrate.

In some embodiments, the coating material is heated, where gaps formed by the antenna track or integrated circuit unit between the antenna substrate and the first stack layer before heating the coating material are at least 25% filled by thermal expansion of the coating material. In some embodiments, a plurality of other antenna assemblies each including an antenna track, and at least two contact pads, are formed on the first surface of the antenna substrate, and integrated circuit units are coupled to the at least two contact pads on each of the plurality of other antenna assemblies. In some embodiments, the coating material is heated, where gaps formed by the antenna tracks or integrated circuit units between the antenna substrate and the first stack layer before heating the coating material are at least 25% filled by thermal expansion of the coating material.

In some embodiments, the antenna assembly comprises etched copper, deposited copper, etched aluminum, deposited aluminum, etched gold, deposited gold, conductive pastes, conductive ink, conductive polymers, molybdenum, embedded copper, or any combination thereof. In some embodiments, the antenna substrate comprises one or more non-conductive carrier materials including PET (polyester), FR-4 (or any other printed circuit board (PCB) material), PI (polyimide), BT (bismaleimide-triazine), PE (polyethylene), PVC (polyvinylchloride), PC (polycarbonate), PEN (polyethylene naphthalate), Teslin (silica-filled polyethylene), paper, or any combination thereof. In some embodiments, the first stack layer comprises PET (polyester), PI (polyimide), BT (bismaleimide-triazine), PE (polyethylene), PVC (polyvinylchloride), PC (polycarbonate), PEN (polyethylene naphthalate), Teslin (silica-filled polyethylene), paper, or any combination thereof.

In some embodiments, the first stack layer and the antenna substrate are laminated between first and second laminate layers, and first and second overlay layers are provided to the first and second laminate layers. In some embodiments, the first and second laminate layers comprise PET (polyester), PI (polyimide), BT (bismaleimide-triazine), PE (polyethylene), PVC (polyvinylchloride), PC (polycarbonate), PEN (polyethylene naphthalate), Teslin (silica-filled polyethylene), paper, or any combination thereof. In some embodiments, visual display information is printed on the first overlay layer, the second overlay layer, or both the first and second overlay layers.

In some embodiments, the integrated circuit unit is positioned in a recess in the antenna substrate, in a recess in the first or second stack layer, or recesses in the antenna substrate, the first stack layer, and/or the second stack layer. In some embodiments, the RFID structure comprises a RFID card component, a smartcard component, a ticket component, a passport component, a RFID label, a RFID sticker, a RFID poster, or any combination thereof.

Other aspects and advantages of the invention will become apparent from the following detailed description, taken in conjunction with the accompanying drawings, illustrating the principles of the invention by way of example only.

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the invention.

DETAILED DESCRIPTION

Figure 1:
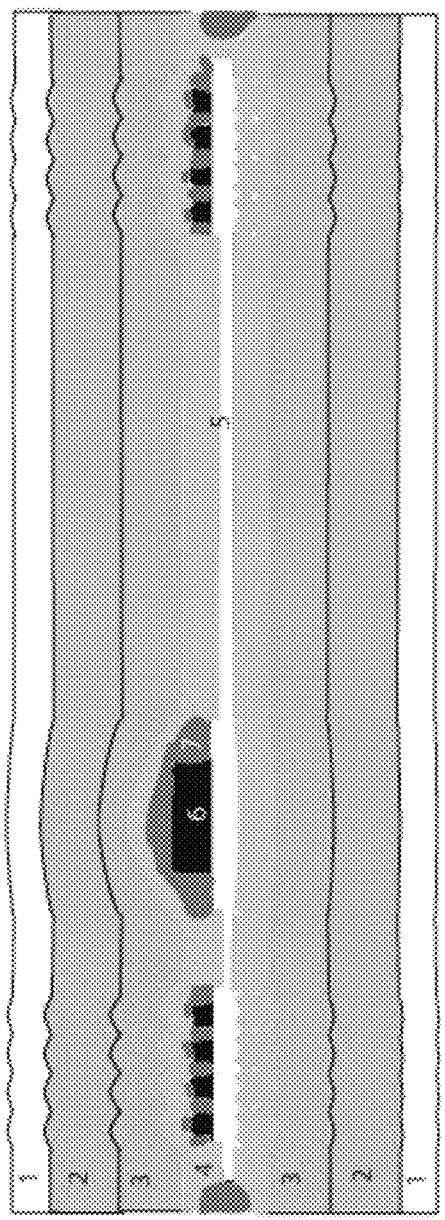
FIG. 1 is a cross-sectional view of an exemplary laminated structure according to the prior art.
Figure 2:
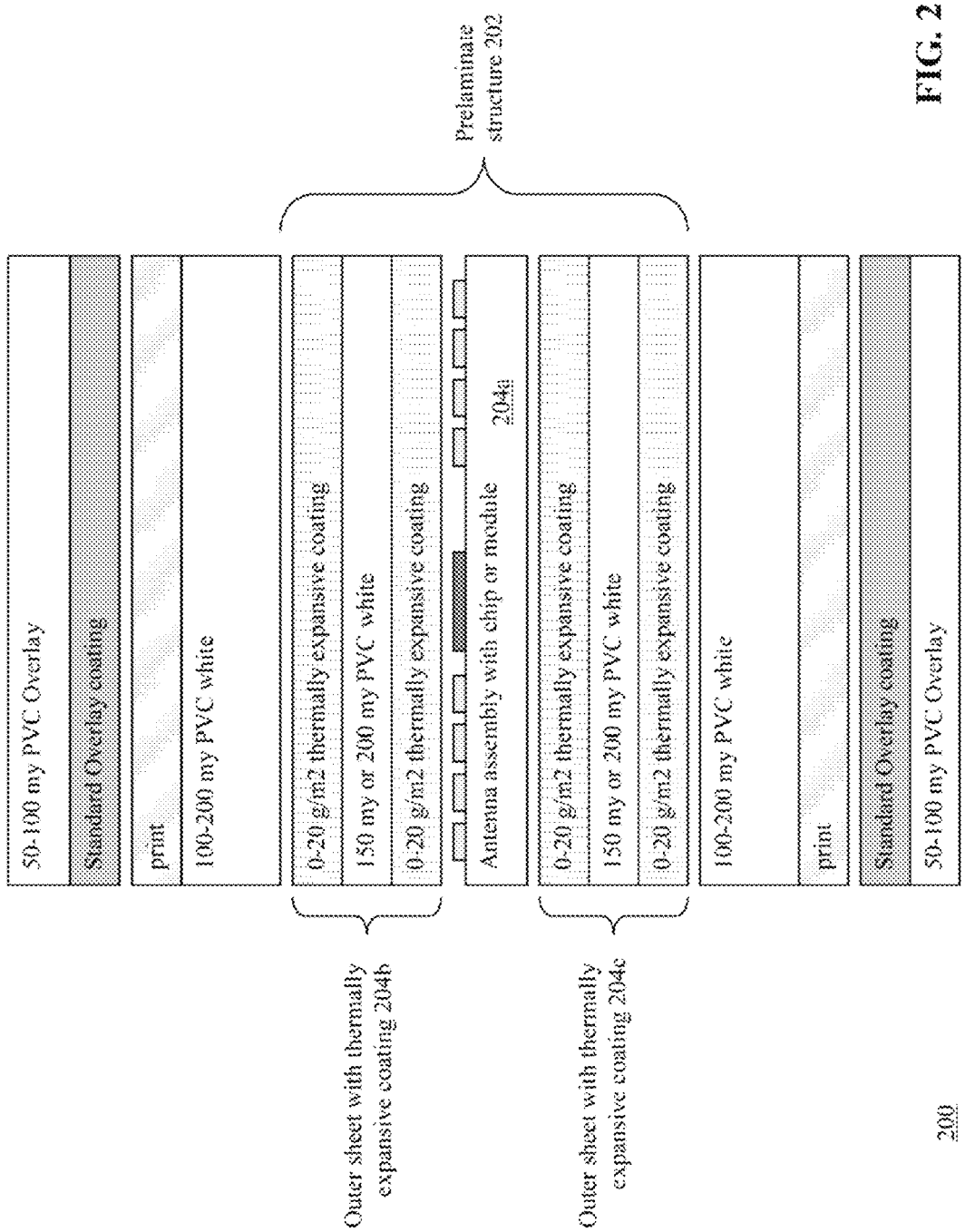
FIG. 2 is a cross-sectional view of an exemplary laminated structure according to an embodiment of the invention.

FIG. 2 illustrates a cross-sectional view of an exemplary laminated structure 200 according to an embodiment of the invention. A prelaminate structure 202 (also called a prelam) includes the three center layers of the laminated structure 200. The center layer 202a, or core layer, of the prelam 202 includes the antenna assembly. The integrated circuit unit, or IC unit, (e.g., a chip) is typically buried in a recess in the center layer 204a to protect it and to try and maintain a constant thickness of the prelam 202 surface. The laminated structure 200 (or stack) is put into a laminating machine which provides controlled temperature and/or pressure settings for a defined period of time(s) for the purpose of fusing the respective layers together and producing an integrated card. In some embodiments, the temperature profile as a function of time for the laminating machine can be controlled.

The card layers can be constructed from PVC and similar plastics, because such materials melt before burning and, in some cases, additives can be included to change the characteristics of the card layers when heated. In this way, it is possible to create a material stack to melt within a range of temperatures and make the lamination of the card more controllable by having layers in the stack soften at different temperatures.

In some embodiments, the prelam 202 is manufactured by one company and then sold to another company for finishing into a card. In some embodiments, prelams are laminated in sheet form and are not singulated until the outer layer(s) are put on by the second company. The outer layers can provide thickness and stiffness to the card as well as provide a support structure for graphics for such things as magnetic stripes and/or holograms. The final assembly can be accomplished using a laminating machine. The IC unit is partially protected from the large pressure of the laminating machine by being housed in its recess.

As shown in FIG. 2, the prelam 202 includes two outer sheets 204b and 204c that are coated with a unidirectional thermally expansive material. When heated, the unidirectional thermally expansive material expands and, in some embodiments, fills up the gaps/spaces that form between the layers of the prelam 202, and also between the prelam 202 and the outer layers of the laminated structure. In some embodiments, the temperature at which expansion of the materials is triggered can be selectable. When the unidirectional thermally expansive material is cooled after it is heated, the material maintains its volume. In some embodiments, the volume of the material can decrease slightly (e.g., less than 5%).

The term "unidirectional" refers to the characteristic of the material in which it does not return to its original volume upon cooling from a higher temperature. In addition, the material can create a strong bond with polyester and similar materials, from which etched inlays can be constructed. When the lamination process is complete, the unidirectional thermally expansive material is solid and forms part of the prelam 202 construction. In some embodiments, the unidirectional thermally expansive material is benign and does not interfere with the operation of the prelam 202 (including the antenna assembly) and/or the final laminated card structure.

In some embodiments, the unidirectional thermally expansive coating material includes at least 60% of polyurethane polymers, at least 0.1% of acrylic copolymers, and at least 0.1% of hydrocarbons (e.g., isobutane and/or isopentane). In some embodiments, the unidirectional thermally expansive coating material includes 80-98% of polyurethane polymers and 20%-2% of acrylic copolymers and hydrocarbons. The polyurethane polymer can include aliphatic polyurethane surfactants free to formulate thermal activated adhesives. The polyurethane polymer can be in a waterborne dispersion. The tensile strength of the coating material can be 5 MPa and/or can include an elongation factor of 550-650%.

In some embodiments, the polyurethane polymer can include ESABOND DP 11 manufactured by Lamberti Chemical Specialties Co., Ltd. of Shanghai, China. The acrylic copolymers and hydrocarbons can include thermoexpandable microcapsules that encapsulate volatile hydrocarbons with acrylic copolymers. The average particle size of microcapsules can be between 6 and 12 μm. The chemical composition of the microcapsules can include a shell (acrylonitrile-copolymer) and a core (isobutene). In some embodiments, expansion of the particles can begin at between 80° and 90° C.elsius and end expansion between 110° and 120° C.elsius. In some embodiments, the coating material can be heated above the temperature trigger point for between 2 and 4 minutes. The acrylic copolymers and hydrocarbons can include Micropearl F-36 manufactured by Lehmann & Voss & Co. of Hamburg, Germany.

The technology advantageously simplifies the production of chipcard structures, smartcard structures, passport structures, or other similar structures by increasing the quality with respect to the surface flatness/unevenness, decreasing the optical appearance of wires and/or IC units (e.g., chip or chip modules), eliminating the process of prelamination, using polyester inlays without cut out frame for the chip, and/or increasing the bond strength between materials (e.g., to polyester).

While FIG. 2 depicts a particular application of the unidirectional thermally expansive material, other applications can be contemplated that remain within the scope of the invention. Genearlly, the unidirectional thermally expansive material can be applied to any surface or combination of surfaces in the layers of the prelam 202 or the interior of laminated structure 200.

Figure 3:
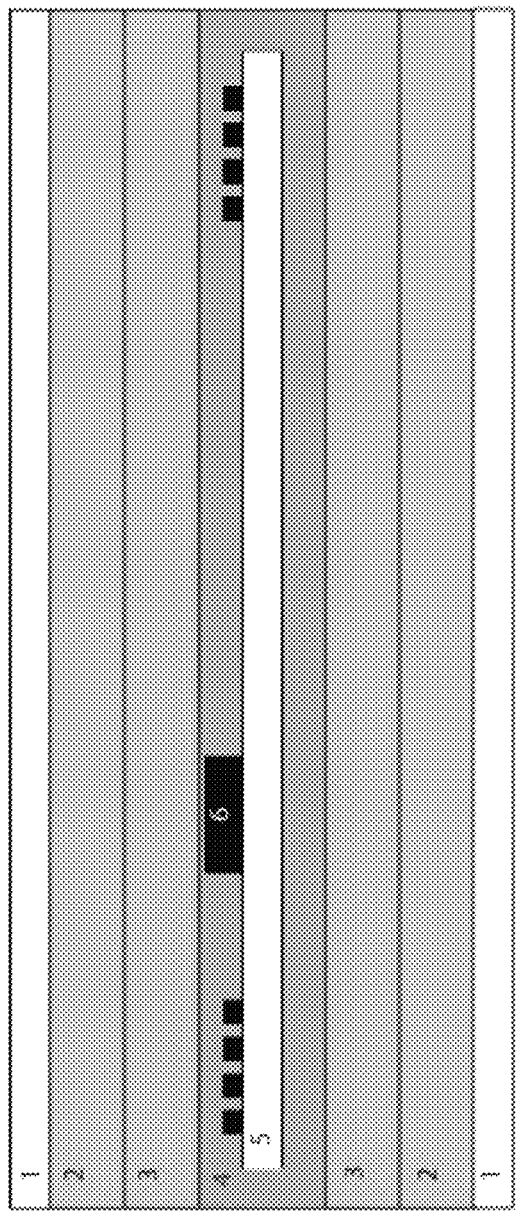
FIG. 3 is a cross-sectional view of an exemplary laminated structure according to an embodiment of the invention.

FIG. 3 is a cross-sectional view of an exemplary laminated structure 300 according to an embodiment of the invention. Layer 5 is an antenna substrate (e.g., polyester) that supports an antenna assembly and an integrated circuit unit 6. Layer 5 is surrounded on all sides by Layer 4. Layer 4 is the unidirectional thermally expansive material after it has been heated. Layer 3 is a white core PVC with heat seal coating HS-26X. Layer 2 is a white core PVC front-side layer that includes print information. Layer 1 is a PVC overlay with a standard heat seal coating.

Figure 4:
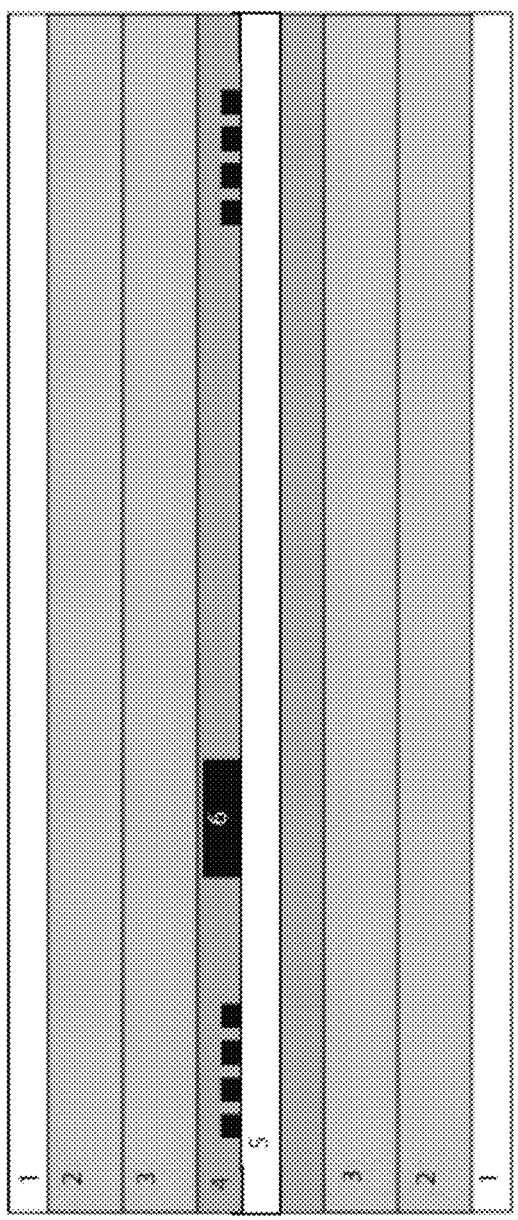
FIG. 4 is a cross-sectional view of an exemplary laminated structure according to an embodiment of the invention.

FIG. 4 is a cross-sectional view of an exemplary laminated structure 400 according to an embodiment of the invention. Layer 5 is an antenna substrate (e.g., polyester) that supports an antenna assembly and an integrated circuit unit 6. Layer 5 is covered on its top and bottom surfaces by Layer 4. Layer 4 is the unidirectional thermally expansive material after it has been heated. Layer 3 is a white core PVC with heat seal coating HS-26X. Layer 2 is a white core PVC front-side layer that includes print information. Layer 1 is a PVC overlay with a standard heat seal coating.

One skilled in the art will realize the technology may be embodied in other specific forms without departing from the spirit or essential characteristics thereof. The foregoing embodiments are therefore to be considered in all respects illustrative rather than limiting of the technology described herein. Scope of the technology is thus indicated by the appended claims, rather than by the foregoing description, and all changes that come within the meaning and range of equivalency of the claims are therefore intended to be embraced therein.

What is claimed:

1. A method of manufacturing an RFID structure, the method comprising:
   providing an antenna substrate;
   providing a first stack layer;
   forming, on a first surface of the antenna substrate, an antenna assembly including an antenna track, and at least two contact pads;
   coupling an integrated circuit unit to the at least two contact pads;
   coating a first surface of the first stack layer, the first surface of the antenna substrate, or both with a unidirectional thermally expansive coating material;
   positioning the first surface of the antenna substrate to be adjacent to the first surface of the first stack layer; and
   heating the coating material, wherein gaps formed by the antenna track or integrated circuit unit between the antenna substrate and the first stack layer before heating the coating material are at least 25% filled by thermal expansion of the coating material and the first stack layer exhibits a uniformly flat outer surface after heating.

2. The method of claim 1, further comprising:
   providing a second stack layer;
   coating a first surface of the second stack layer or a second surface of the antenna substrate opposite the first surface of the antenna substrate with the thermally expansive coating material;
   positioning the first surface of the second stack layer to be adjacent to the second surface of the antenna substrate; and
   wherein the second stack layer exhibits a uniformly flat outer surface after heating.

3. The method of claim 1, further comprising forming, on the second surface of the antenna substrate, a second antenna assembly including a second antenna track.

4. The method of claim 1, further comprising:
   forming, on the first surface of the antenna substrate, a plurality of other antenna assemblies each including an antenna track, and at least two contact pads; and
   coupling integrated circuit units to the at least two contact pads on each of the plurality of other antenna assemblies.

5. The method of claim 1, wherein the antenna assembly comprises etched copper, deposited copper, etched aluminum, deposited aluminum, etched gold, deposited gold, conductive pastes, conductive ink, conductive polymers, molybdenum, embedded copper, or any combination thereof.

6. The method of claim 1, wherein the antenna substrate comprises one or more non-conductive carrier materials including PET (polyester), FR-4 (or any other printed circuit board (PCB) material), PI (polyimide), BT (bismaleimide-triazine), PE (polyethylene), PVC (polyvinylchloride), PC (polycarbonate), PEN (polyethylene naphthalate), Teslin (silica-filled polyethylene), paper, or any combination thereof.

7. The method of claim 1, wherein the first stack layer comprises PET (polyester), PI (polyimide), BT (bismaleimide-triazine), PE (polyethylene), PVC (polyvinylchloride), PC (polycarbonate), PEN (polyethylene naphthalate), Teslin (silica-filled polyethylene), paper, or any combination thereof.

8. The method of claim 1, further comprising:
   laminating the first stack layer and the antenna substrate between first and second laminate layers; and
   providing first and second overlay layers to the first and second laminate layers.

9. The method of claim 1, wherein the first and second laminate layers comprise PET (polyester), PI (polyimide), BT (bismaleimide-triazine), PE (polyethylene), PVC (polyvinylchloride), PC (polycarbonate), PEN (polyethylene naphthalate), Teslin (silica-filled polyethylene), paper, or any combination thereof.

10. The method of claim 1, further comprising printing visual display information on the first overlay layer, the second overlay layer, or both the first and second overlay layers.

11. The method of claim 1, wherein the integrated circuit unit is positioned in a recess in the antenna substrate, in a recess in the first or second stack layer, or recesses in both the antenna substrate, the first stack layer, and/or the second stack layer.

12. The method of claim 1, wherein the RFID structure comprises a RFID card component, a smartcard component, a ticket component, a passport component, a RFID label, a RFID sticker, a RFID poster, or any combination thereof.

13. The method of claim 1, wherein the unidirectional thermally expansive coating material includes at least 60% of polyurethane polymers, at least 0.1% of acrylic copolymers, and at least 0.1% of hydrocarbons.

14. The method of claim 13, wherein the unidirectional thermally expansive coating material includes 80-98% of polyurethane polymers and 20-2% of acrylic copolymers and hydrocarbons.

15. The method of claim 13, wherein the acrylic copolymers and hydrocarbons include thermoexpandable microcapsules that encapsulate volatile hydrocarbons with acrylic copolymers.

16. The method of claim 15, wherein the average particle size of the microcapsules is between 6 and 12 µm.

17. The method of claim 15, wherein expansion of the microcapsules begins at between 80° and 90° Celsius.

18. The method of claim 15, wherein expansion of the microcapsules ends at between 110° and 120° Celsius.

19. An RFID structure comprising:
an antenna substrate including, on a first surface, an antenna assembly having an antenna track and at least two contact pads;
an integrated circuit unit coupled to the at least two contact pads;
a first stack layer positioned adjacent to the first surface of the antenna substrate; and
an unheated unidirectional thermally expansive material separating the antenna substrate and the first stack layer, wherein gaps are defined between one or more portions of the antenna assembly and the thermally expansive material; and
wherein upon heating the material, the gaps are at least partially filled by thermal expansion of the material and the first stack layer exhibits a uniformly flat outer surface after heating.

20. An RFID structure comprising:
an antenna substrate including, on a first surface, an antenna assembly having an antenna track and at least two contact pads;
an integrated circuit unit coupled to the at least two contact pads;
a first stack layer positioned adjacent to the first surface of the antenna substrate; and
a previously heated unidirectional thermally expansive material separating the antenna substrate and the first stack layer, wherein gaps formed between the antenna substrate and the first stack layer are at least partially filled by the thermally expansive material and the first stack layer exhibits a uniformly flat outer surface.

* * * * *